United States Patent

Miyashita et al.

[11] Patent Number: 5,439,723
[45] Date of Patent: Aug. 8, 1995

[54] SUBSTRATE FOR PRODUCING SEMICONDUCTOR WAFER

[75] Inventors: Motoharu Miyashita; Norio Hayafuji; Yutaka Mihashi, all of Itami, Japan

[73] Assignee: Mitsubishi Denki Kabushiki Kaisha, Tokyo, Japan

[21] Appl. No.: 150,879

[22] Filed: Nov. 12, 1993

Related U.S. Application Data

[62] Division of Ser. No. 977,154, Nov. 16, 1992, Pat. No. 5,279,077.

[30] Foreign Application Priority Data

Mar. 12, 1992 [JP] Japan ................................ 4-089416

[51] Int. Cl.⁶ ............................................. B32B 3/02
[52] U.S. Cl. .................................. 428/66.7; 428/131; 428/134; 428/135; 428/136; 428/156; 428/167; 428/192
[58] Field of Search ............... 428/131, 134, 135, 136, 428/156, 167, 192, 64, 66; 437/225, 249

[56] References Cited

U.S. PATENT DOCUMENTS

| | | | |
|---|---|---|---|
| 4,366,198 | 12/1982 | Ramspacher | 428/134 |
| 4,883,771 | 11/1989 | Kumabe | 437/129 |
| 4,901,328 | 2/1990 | Matsui | 372/46 |

FOREIGN PATENT DOCUMENTS 62-279652 12/1987 Japan .

*Primary Examiner*—Nasser Ahmad
*Attorney, Agent, or Firm*—Leydig, Voit & Mayer

[57] ABSTRACT

A semiconductor wafer includes a notch or a hole used in preparing an orientation flat on the wafer. The notch in the wafer includes a side that is perpendicular to the surfaces of the wafer and aligned along a cleavage plane of the wafer for forming the orientation flat by cleaving. A hole in a wafer preferably includes an axis aligned along the cleaving plane. A sharp, non-rounded cleavage is formed by preparing the notch or hole after the completion of any etching processes or other steps that may round the edges of the flat. The sharp edges aid in achieving a precision alignment using the orientation flat.

8 Claims, 5 Drawing Sheets

SUBSTRATE FOR PRODUCING SEMICONDUCTOR WAFER

This disclosure is a division of application Ser. No. 07,977,154, filed Nov. 16, 1992, now U.S. Pat. No. 5,279,077.

FIELD OF THE INVENTION

The present invention relates to a method for producing a semiconductor wafer having an orientation flat formed by cleaving a portion of the wafer along a cleavage plane. The invention also relates to a semiconductor wafer.

BACKGROUND OF THE INVENTION

FIGS. 5(a)-5(e) illustrate a method for forming a GaAs epitaxial wafer having a cleavage plane orientation flat. In these figures, reference numeral 1 designates a GaAs monocrystalline ingot. This GaAs monocrystalline ingot 1 is formed by a boat grown method in which GaAs is melted in an electric furnace and a crystalline seed is moved from a high temperature region to a low temperature region in the furnace to grow the GaAs ingot with the crystalline seed as a core, Alternatively, it may be formed by a pull method in which GaAs is melted in a crucible and the melted GaAs is slowly pulled up by a seed crystal bar, Reference numeral 2 designates a cylindrical GaAs monocrystalline ingot made of the GaAs monocrystalline ingot 1. Reference numeral 3 designates a GaAs wafer obtained by slicing the cylindrical GaAs monocrystalline ingot 3 in a prescribed thickness. Reference numeral 4 designates a GaAs wafer having an orientation flat 4a formed by cleaving a portion of the GaAs wafer 3 along a cleavage plane. Generally, the orientation flat 4a is formed at a position relating to a crystal orientation of the GaAs substrate 3 and serves as a mark when the orientation of the wafer is detected in a subsequent process. Reference numeral 5 designates a GaAs epitaxial wafer in which an epitaxial layer 51 has been grown on the GaAs wafer 4.

A description is given of the production process. Initially, as illustrated in FIG. 5(a), a high quality GaAs monocrystalline ingot 1 is formed by the above-described boat grown method or the pull method. Then, as illustrated in FIG. 5(b), opposite end portions of the ingot 1 are cut off to remove deformed portions of the ingot 1. Then, the ingot 1 is formed into a cylindrical shape by polishing its periphery, whereby a diameter of a wafer to be formed is determined. Preferably, the diameter is a few inches.

Thereafter, the cylindrical GaAs monocrystalline ingot 2 is sliced using a very thin diamond blade, providing a GaAs wafer 3 shown in FIG. 5(c). When the diameter of the wafer is 2 inches, it is sliced in a thickness of about 400 microns. When the diameter is 3 inches, it is sliced in a thickness of about 600 microns.

Then, as illustrated in FIG. 5(d), an end portion of the GaAs wafer 3 is cleaved along a cleavage plane to form an orientation flat 4a. Since there are differences in thicknesses of a plurality of GaAs wafers 4 with the orientation flat 4a due to the slicing process, both surfaces of the GaAs wafers 4 are lapped in a solution comprising aluminium oxide and glycerine or the like while applying pressure thereto, whereby the thicknesses of the GaAs wafers 4 are made even. Then, a damaged layer and a contaminated layer each about 10 microns thick on the surface and the periphery of the wafer 4 due to the lapping are removed by etching. Then, abrasive is dropped onto the wafer and the wafer is polished using a porous pad or the like to improve the flatness of the wafer, resulting in a mirrorlike surface of the GaAs wafer 4.

Thereafter, as illustrated in FIG. 5(e), an epitaxial layer 51 is grown on the surface of the GaAs wafer 4 by MOCVD or the like, resulting in a GaAs epitaxial wafer 5 with the cleavage plane serving as the orientation flat.

FIGS. 6(a)-6(e) illustrate another conventional method for producing the GaAs epitaxial wafer with the cleavage plane as the orientation flat. In this method, after directly slicing a GaAs monocrystalline ingot, a prescribed diameter of a wafer to be formed is obtained by stamping and then an orientation flat is formed. In FIGS. 6(a)-6(e), reference numeral 6 designates a GaAs wafer for stamping obtained by directly slicing the GaAs monocrystalline ingot 1.

Initially, as illustrated in FIG. 6(a), a GaAs monocrystalline ingot 1 is formed by the boat grown method, the pull method, or the like. Then, the ingot 1 is sliced in a prescribed thickness, providing a GaAs wafer 6 shown in FIG. 6(b).

Then, as illustrated in FIG. 6(c), a GaAs wafer 3 is stamped out from the GaAs wafer 6 using a trimming die (not shown) having a diameter equal to a desired diameter of a wafer to be formed.

Then, as illustrated in FIG. 6(d), an end portion of the GaAs wafer 3 is cleaved along a cleavage plane to form an orientation flat 4a. Thereafter, lapping, etching, and polishing processes are applied to the GaAs wafer 4 with the orientation flat 4a to provide a mirrorlike surface of the GaAs wafer 4.

Then, as illustrated in FIG. 6(e), an epitaxial layer 51 is grown on the GaAs wafer 4 by MOCVD or the like, resulting in a GaAs epitaxial wafer 5 with the cleavage plane as the orientation flat.

In the above-described conventional methods, since the orientation flat is produced by cleaving the wafer along the cleavage plane, the orientation flat is produced with high precision. However, since the surface treatment like the polishing is performed after the formation of the orientation flat 4a, edges of the cleavage plane of the orientation flat are rounded as shown in FIG. 7. In addition, when the epitaxial layer 51 is grown on the wafer 4, the edges of the cleavage plane of the orientation flat 4a are also rounded due to the grown epitaxial layer 51. Therefore, when a position of the GaAs epitaxial wafer 5 is detected on the basis of the orientation flat 4athe , precision of the position detection is lowered.

In addition, when the orientation flat 4a is formed by cleaving the GaAs wafer 4, the GaAs wafer 4 is unfavorably cracked or broken, resulting in a poor production yield.

SUMMARY OF THE INVENTION

It is an object of the present invention to provide a method for forming a semiconductor wafer having a sharp cleavage plane as an orientation flat in a simple process with a good yield.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to a first aspect of the present invention, in a method for producing a semiconductor wafer having a cleavage plane as an orientation flat, a semiconductor monocrystalline ingot is formed into a cylindrical shape, a groove is formed at the side of the cylindrical ingot in a direction parallel with a cleavage direction, the cylindrical ingot having the groove is sliced in a prescribed thickness to form a semiconductor wafer, the surface of the wafer is treated to provide a mirrorlike surface, and the wafer having the mirrorlike surface is cleaved from the groove, resulting in a semiconductor wafer with a cleavage plane as an orientation flat.

According to a second aspect of the present invention, in a method for producing a semiconductor wafer having a cleavage plane as an orientation flat, a semiconductor monocrystalline ingot is sliced in a prescribed thickness to form a wafer, a circular wafer is stamped from the sliced wafer, a groove or a hole is formed through the circular wafer so that the groove or hole is on a line along which the wafer is cleaved to form an orientation flat, the surface of the wafer is treated to produce a mirrorlike surface on the wafer, and the wafer having the mirrorlike surface is cleaved from the groove or hole, resulting in a semiconductor wafer having a cleavage plane as an orientation flat.

According to a third aspect of the present invention, a semiconductor wafer having a cleavage plane as an orientation flat includes a notch or a hole through the wafer, on a line along which the wafer is cleaved to form the orientation flat.

According to the present invention, the wafer is easily cleaved from the groove or the hole, so that breakage of the wafer is significantly decreased. In addition, since the wafer is cleaved after the surface treatment, the edges of the cleavage plane are not rounded due to the surface treatment, resulting in a sharp cleavage plane as an orientation flat.

DETAILED DESCRIPTION OF THE PREFERRED EMBODIMENTS

Figure 1A:
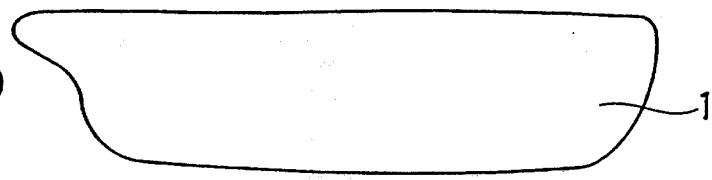
FIGS. 1(a)-1(f) are diagrams illustrating steps in a method for producing a semiconductor wafer in accordance with a first embodiment of the present invention.

FIGS. 1(a)-1(f) are diagrams illustrating steps in a method for producing a semiconductor wafer in accordance with a first embodiment of the present invention. In these figures, the same reference numerals as in FIGS. 5(a)-5(e) designate the same or corresponding parts. Reference numeral 8 designates a GaAs wafer having a V-shaped notch 7 at which the wafer 8 is cleaved to form an orientation flat. Reference numeral 9 designates a GaAs epitaxial wafer on which an epitaxial layer 51 is formed.

A description is given of the production process.

Figure 1B:
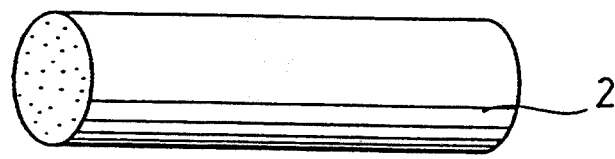

Initially, as illustrated in FIG. 1(a), a GaAs monocrystalline ingot 1 is formed by the conventional boat grown method, pull method, or the like. Then, as illustrated in FIG. 1(b), opposite end portions of the ingot 1 are cut off to remove deformed portions of the ingot 1. Then, the periphery of the ingot 2 is polished to form the ingot 2 into a cylindrical shape, whereby the diameter of a wafer to be formed is determined. Preferably, the diameter is a few inches.

Figure 1C:
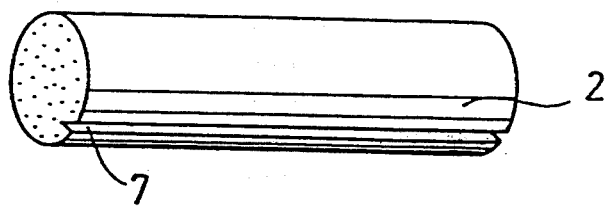

Then, as illustrated in FIG. 1(c), crystal orientation of the cylindrical GaAs monocrystalline ingot 2 is detected by X-ray analysis or the like. Thereafter, a V-shaped groove 7 having a depth of about 0.1 mm is formed at the side of the ingot 2 so that a side surface of the groove 7 aligns with a cleavage plane along which a wafer 8 is cleaved to form an orientation flat. Preferably, the groove 7 is formed by dicing or etching.

Figure 1D:
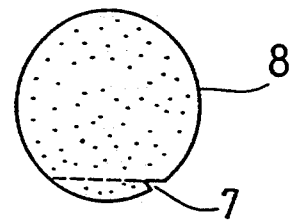

Thereafter, the GaAs monocrystalline ingot 2 with the V-shaped groove 7 is sliced using a very thin diamond blade, providing a GaAs wafer 8 shown in FIG. 1(d). When the diameter of the wafer is 2 inches, it is sliced in a thickness of about 400 microns. When the diameter is 3 inches, it is sliced in a thickness of about 600 microns.

Figure 1E:
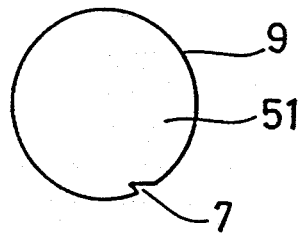

Then, a surface treatment, such as chamfering, etching, polishing or the like, is applied to the GaAs wafer 8 with the notch 7, a remnant of the groove 7 in the wafer 8 to produce a mirrorlike surface on the GaAs wafer 8. Then, as illustrated in FIG. 1(e), an epitaxial layer 51 having a desired layer structure, for example, a laser structure is grown on the GaAs wafer 8 by MOCVD or the like, resulting in a GaAs epitaxial wafer 9 with the epitaxial layer 51.

Figure 1F:
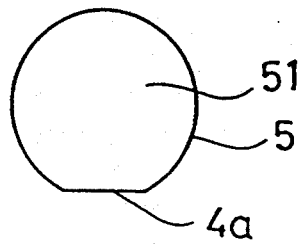

Thereafter, the GaAs wafer 9 is cleaved from the V-shaped groove 7 to form an orientation flat 4a. Thus, a cleaved GaAs epitaxial wafer 5 with the cleavage plane as the orientation flat 4a is achieved as shown in FIG. 1(f). In this case, although the epitaxial layer 51 formed on the GaAs wafer 8 is also cleaved when the GaAs wafer 8 is cleaved, since the crystal-line epitaxial layer 51 is uniformly oriented, the epitaxial layer 51 is not broken by a crack or the like generated in a direction different from the orientation flat 4a.

According to the first embodiment of the present invention, edges of the orientation flat 4a are not rounded due to the surface treatment and the growth of the epitaxial layer 51. In addition, the GaAs epitaxial wafer 9 is easily cleaved at the notch 7, so that breakage in the GaAs substrate is significantly decreased.

FIGS. 2(a)-2(e) are diagrams illustrating steps in a method for producing a semiconductor wafer in accordance with a second embodiment of the present invention. In this method, a GaAs monocrystalline ingot is directly sliced and then a desired diameter of a wafer to be formed is obtained by stamping.

Figure 2A:
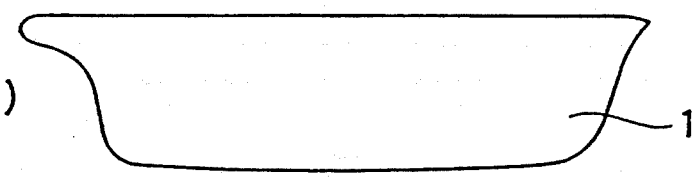
FIGS. 2(a)-2(e) are diagrams illustrating steps in a method for producing a semiconductor wafer in accordance with a second embodiment of the present invention.
Figure 2B:
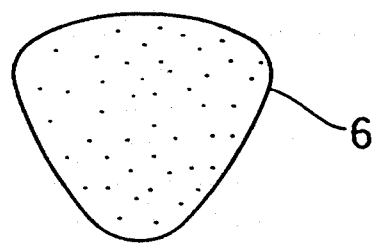

Initially, as illustrated in FIG. 2(a), a GaAs monocrystalline ingot 1 is formed by the conventional boat grown method, pull method, or the like. Then, the ingot 1 is sliced in a prescribed thickness, providing a GaAs wafer 6 shown in FIG. 2(b).

Figure 2C:
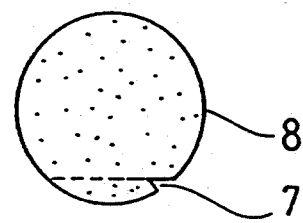
Figure 2D:
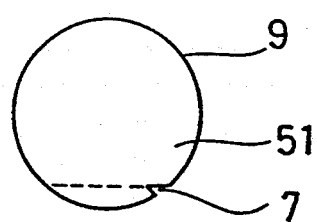

Then, as illustrated in FIG. 2(c), crystal orientation of the GaAs wafer 6 is detected by X-ray analysis or the like. Then, a GaAs wafer with a desired shape and a desired diameter is stamped out from the GaAs wafer 6 using a trimming die (not shown), ultrasonic energy, or the like. Then, a V-shaped notch 7 having a depth of about 0.1 mm is formed in the GaAs wafer so that a side wall of the notch aligns with a cleavage plane along which the substrate is cleaved to form an orientation flat. Preferably, the notch 7 is formed by dicing or etching. Thus, a notched GaAs wafer 8 shown in FIG. 2(d) is formed.

Figure 2E:
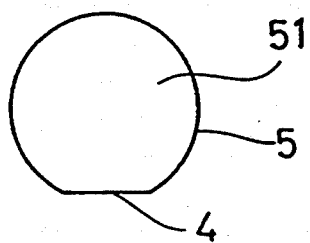

Then, as illustrated in FIG. 2(e), a surface treatment, such as lapping, etching, polishing or the like, is performed to the notched GaAs wafer 8 to produce a mirrorlike surface on the notched GaAs wafer 8. Thereafter, an epitaxial layer 51 having a desired layer structure, for example, a laser structure is grown on the notched wafer 8 by MOCVD or the like.

Thereafter, the GaAs epitaxial wafer 9, on which the epitaxial layer 51 is present, is cleaved from the V-shaped notch 7 to form an orientation flat 4a. Thus, a GaAs epitaxial wafer 5 having a sharp cleavage plane at the orientation flat 4a is achieved.

According to the second embodiment of the present invention, the GaAs epitaxial wafer 5 having a sharp cleavage plane at the orientation flat is formed using the stamping method with an improved production yield.

Figure 3:
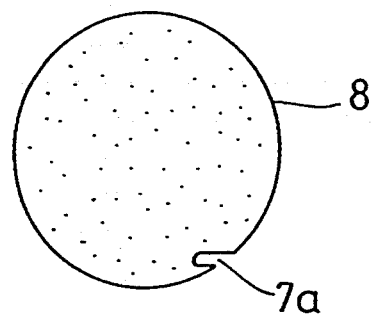
FIGS. 3(a)-3(d) are diagrams illustrating various examples of notches and holes which are formed in a wafer in the method according to the first and second embodiments.
Figure 3:
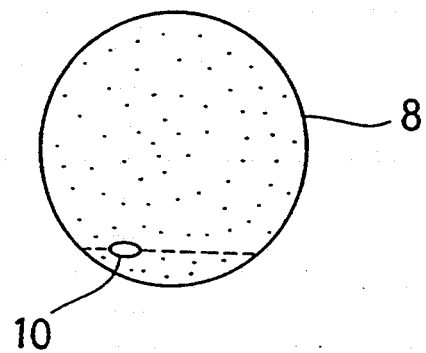
Figure 3:
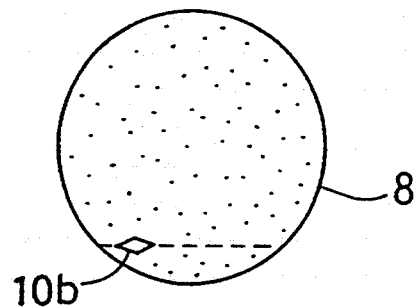
Figure 3:
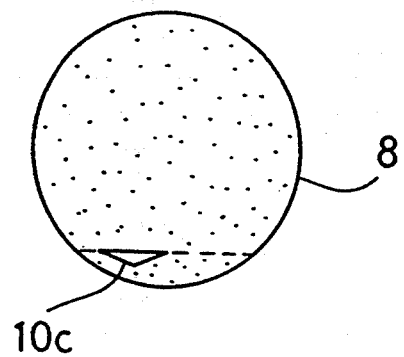

While in the above-described first and second embodiments the V-shaped notch 7 is formed as a clue for cleaving the substrate to form the orientation flat 4a, a U-shaped notch 7a may be formed as shown in FIG. 3(a). Also in this case, a GaAs epitaxial wafer having a sharp cleavage plane as an orientation flat is formed with an improved production yield. In addition, by employing the U-shaped groove, the GaAs wafer is prevented from cracking or breaking when the GaAs ingot with the groove 7a is sliced to provide the wafer 8 or when stress is applied to the wafer 8 by handling during the surface treatment in the step before forming the epitaxial layer.

While in the above-described second embodiment the V-shaped notch 7 is formed at an end of a line along which the wafer is cleaved to form the orientation flat, an oval hole 10 shown in FIG. 3(b), a rhomboid hole 10b shown in FIG. 3(c), or a triangular hole shown in FIG. 3(d) may be formed so that a major axis thereof is aligned with the line along which the wafer is cleaved to form an orientation flat. Also in this case, a GaAs epitaxial wafer having a sharp cleavage plane as an orientation flat is formed with an improved production yield. In addition, the GaAs wafer is prevented from cracking or breaking when the GaAs ingot with the hole 10, 10b, or 10c is sliced to provide the GaAs wafer or when a stress is applied to the GaAs wafer by a handling during the surface treatment in the step before forming the epitaxial layer.

In the above-described first and second embodiments, the GaAs epitaxial wafer 5 is formed by growing the epitaxial layer 51 on the GaAs wafer 8. However, if the GaAs wafer 8 is cleaved from the groove or the hole after the surface treatment of the wafer 8 without growing the epitaxial layer 51 thereon, a GaAs wafer with a sharp cleavage plane as an orientation flat is obtained.

Figure 4:
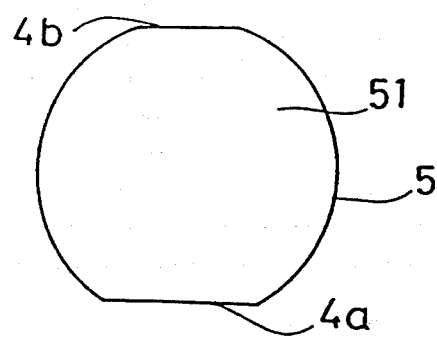
FIG. 4 is a diagram showing a semiconductor wafer having a second flat.
Figure 5A:
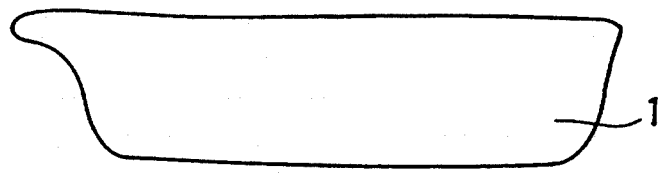
FIGS. 5(a)-5(e) are diagrams illustrating steps in a method for producing a semiconductor wafer in accordance with the prior art.
Figure 5B:
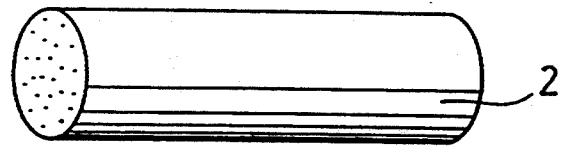
Figure 5C:
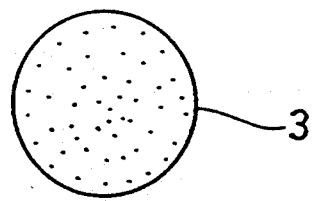
Figure 5D:
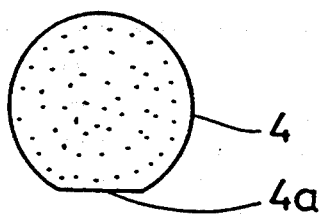
Figure 5E:
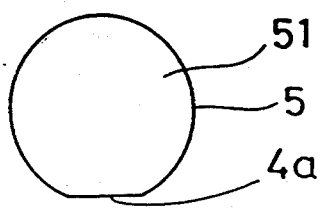
Figure 6A:
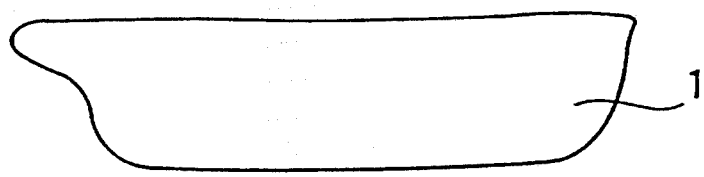
FIGS. 6(a)-6(e) are diagrams illustrating steps in a method for producing a semiconductor wafer in accordance with the prior art.
Figure 6B:
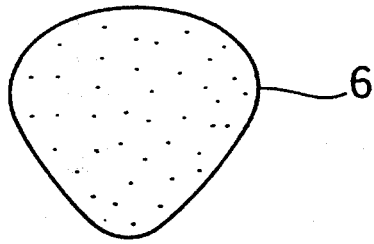
Figure 6C:
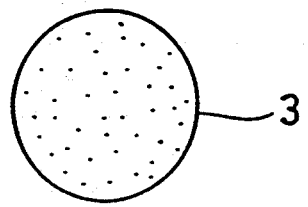
Figure 6D:
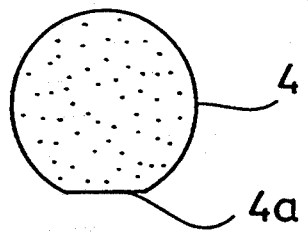
Figure 6E:
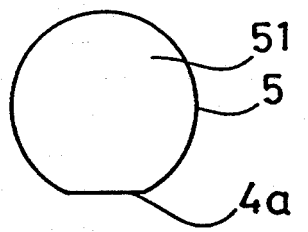
Figure 7:
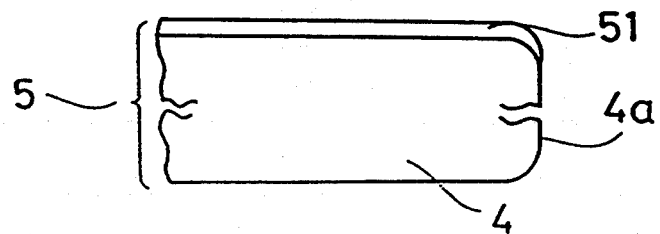
FIG. 7 is an enlarged view of a part of the prior art semiconductor wafer in the vicinity of the orientation flat.

In the above-described first and second embodiments, the orientation flat 4a relating to crystal orientation (first flat) is formed on the wafer. As shown in FIG. 4, a second flat 4b which is smaller than the first flat 4a and reveals the conductivity type of the wafer may be formed in addition to the first flat 4a.

While in the first and second embodiments a GaAs wafer is described, other compound semiconductor materials like InP may be used with the same effects as described above.

In addition, while in the first and second embodiments the GaAs wafer 8 is formed in a circle, it may be formed in an oval or in a shape obtained by removing a portion of a circle along a prescribed arc.

As is evident from the foregoing description, according to the present invention, after a semiconductor wafer is formed, a groove or a hole is formed through the wafer on a line along which the substrate is cleaved to form an orientation flat, the surface substrate is treated to produce a mirrorlike surface, and then the wafer having the mirrorlike surface is cleaved at the groove or hole to form the orientation flat. Therefore, edges of the cleavage plane are not rounded due to the surface treatment. In addition, the wafer is easily cleaved along the cleavage plane at the groove or the hole. As the result, a semiconductor wafer having a sharp cleavage plane as an orientation flat is produced with improved yield, and an alignment is performed with high precision in a subsequent process, such as a photolithography.

What is claimed is:

1. A compound semiconductor wafer comprising a semiconductor monocrystalline disc having opposed substantially planar first and second surfaces and including a notch in the wafer edge, the notch having a side surface substantially perpendicular to the first and second surfaces and aligned with a cleavage plane that insects the edge of the wafer disc twice, the notch extends through the disc thickness, and the cleavage plane provides an orientation flat to said wafer disc.

2. The semiconductor wafer of claim 1 wherein the notch has a V shape at the first and second surfaces of the wafer.

3. The semiconductor wafer of claim 3 wherein the notch has a U shape at the first and second surfaces of the wafer.

4. A compound semiconductor wafer comprising a semiconductor monocrystalline having opposed substantially planar first and second surfaces and including a hole through the wafer aligned with a cleavage plane that intersect edge of the wafer disc twice, the hole having a side surface substantially perpendicular to the first and second surfaces of the disc, and the cleavage plane provides an orientation flat to said wafer disc.

5. The semiconductor wafer of claim 4 wherein the hole has a major axis aligned with the cleavage plane of the wafer.

6. The semiconductor wafer of claim 5 wherein the hole has an elliptical shape at the first and second surfaces of the wafer.

7. The semiconductor wafer of claim 5 wherein the hole has an rhombus shape at the first and second surfaces of the wafer.

8. The semiconductor wafer of claim 4 wherein the hole has a triangular shape having three legs at the first and second surfaces of the wafer wherein one of the legs is aligned with the cleavage plane of the substrate.

* * * * *

UNITED STATES PATENT AND TRADEMARK OFFICE
CERTIFICATE OF CORRECTION

PATENT NO. : 5,439,723
DATED : August 8, 1995
INVENTOR(S) : Miyashita et al.

It is certified that error appears in the above-indentified patent and that said Letters Patent is hereby corrected as shown below:

Column 6, Line 38, change "insects" to --intersects--;

Line 51, change "intersect" to --intersects the--.

Signed and Sealed this

Fourteenth Day of May, 1996

Attest:

BRUCE LEHMAN

Attesting Officer     Commissioner of Patents and Trademarks